United States Patent
Choudhary et al.

(10) Patent No.: US 10,320,370 B2
(45) Date of Patent: Jun. 11, 2019

(54) METHODS AND CIRCUITS FOR ADJUSTING PARAMETERS OF A TRANSCEIVER

(71) Applicant: MoSys, Inc., Santa Clara, CA (US)

(72) Inventors: Prashant Choudhary, Milpitas, CA (US); Haidang Lin, Redwood City, CA (US); Alvin Wang, Saratoga, CA (US); Saman Behtash, Palo Alto, CA (US); Shaishav Desai, San Jose, CA (US)

(73) Assignee: MoSys, Inc., San Jose, CA (US)

( * ) Notice: Subject to any disclaimer, the term of this patent is extended or adjusted under 35 U.S.C. 154(b) by 886 days.

(21) Appl. No.: 13/728,910

(22) Filed: Dec. 27, 2012

(65) Prior Publication Data

US 2013/0169314 A1 Jul. 4, 2013

Related U.S. Application Data (60) Provisional application No. 61/581,904, filed on Dec. 30, 2011.

(51) Int. Cl.
*H03K 5/00* (2006.01)
*H04L 25/03* (2006.01)

(52) U.S. Cl.
CPC ......... *H03K 5/00* (2013.01); *H04L 25/03057* (2013.01); *H04L 25/03885* (2013.01); *H04L 25/03343* (2013.01); *H04L 2025/03356* (2013.01); *H04L 2025/03636* (2013.01); *H04L 2025/03802* (2013.01)

(58) Field of Classification Search
CPC ............... H03K 5/00; H04L 25/03057; H04L 25/03885; H04L 25/03343; H04L 2025/03636; H04L 2025/03356; H04L 2025/03802
USPC ...................................... 702/182, 91; 327/91
See application file for complete search history.

(56) References Cited

U.S. PATENT DOCUMENTS

| | | | | |
|---|---|---|---|---|
| 2005/0134307 A1* | 6/2005 | Stojanovic | ............ | H04L 25/028 326/31 |
| 2007/0254592 A1* | 11/2007 | McCallister | .......... | H03F 1/0205 455/67.11 |
| 2009/0005041 A1* | 1/2009 | Steinberg | ............... | H04W 48/18 455/435.2 |

OTHER PUBLICATIONS

Beukema, Troy et al., "A 6.4-Gb/s CMOS SerDes Core With Feed-Forward and Decision-Feedback Equalization", *IEEE Journal of Solid-State Circuits*, vol. 40, No. 12., (Dec. 2005),1-13.

* cited by examiner

*Primary Examiner* — Yoshihisa Ishizuka (57) ABSTRACT

Methods and circuits for analyzing a signal and adjusting parameters of an equalizer for a signal. The signal is received at a receiver over a channel wherein the signal has a wave form. The signal is equalized at an equalizer using an adjustable parameter for the equalization. Data points from the signal are sampled between upper and lower limits of a threshold at an error sampler. A performance metric of the signal is computed based on a statistical density of the data points from the signal between the upper and lower limits of the threshold.

22 Claims, 8 Drawing Sheets

METHODS AND CIRCUITS FOR ADJUSTING PARAMETERS OF A TRANSCEIVER

RELATED APPLICATIONS

This application claims priority to the provisional patent application Ser. No. 61/581,904, entitled "METHODS AND CIRCUITS FOR ADJUSTING PARAMETERS OF AN EQUALIZER FOR A SIGNAL," with filing date Dec. 30, 2011, by Prashant Choudhary et al., which is herein incorporated by reference in its entirety.

BACKGROUND

Transmitters and receivers are employed to transmit and receive signals. This communication of signals has wide spread applications for communicating data and other information over channels. As signals are transmitted and received, corruption or other degradation may occur. This leads to a loss in quality of the data or information received. Various techniques have been employed to equalize the signal to overcome the effects of such corruption. However, existing techniques for tuning parameters of an equalizer do not achieve optimum performance and there is a need to improve these techniques.

The drawings referred to in this description of embodiments should be understood as not being drawn to scale except if specifically noted.

DESCRIPTION OF EMBODIMENTS

Reference will now be made in detail to embodiments of the present technology, examples of which are illustrated in the accompanying drawings. While the technology will be described in conjunction with various embodiment(s), it will be understood that they are not intended to limit the present technology to these embodiments. On the contrary, the present technology is intended to cover alternatives, modifications and equivalents, which may be included within the spirit and scope of the various embodiments as defined by the appended claims.

Furthermore, in the following description of embodiments, numerous specific details are set forth in order to provide a thorough understanding of the present technology. However, the present technology may be practiced without these specific details. In other instances, well known methods, procedures, components, and circuits have not been described in detail as not to unnecessarily obscure aspects of the present embodiments.

Unless specifically stated otherwise as apparent from the following discussions, it is appreciated that throughout the present description of embodiments, discussions utilizing terms such as "receiving," "performing," "sampling," "computing," "sending," "adjusting," "repeating," "determining," "storing," "selecting," "sampling," or the like, refer to the actions and processes of a computer system, or similar electronic computing device. The computer system or similar electronic computing device, manipulates and transforms data represented as physical (electronic) quantities within the computer system's registers and memories into other data similarly represented as physical quantities within the computer system memories or registers or other such information storage, transmission, or display devices. Embodiments of the present technology are also well suited to the use of other computer systems such as, for example, optical and mechanical computers.

Overview of Adjusting Parameters of a Transceiver

Embodiments of the present technology are for calibrating or adjusting a parameter associated with a transceiver to compensate for corruption in a signal. The present technology may be described as an equalization scheme which uses proprietary performance metrics to auto calibrate and adapt equalization. In one embodiment, the signal is transmitted from a transmitter over a channel to a receiver. The signal can be an electronic signal used for communicating data or other information. In one embodiment, the signal is in the form of a wave such that the receiver can analyze the signal in a binary fashion to obtain data from the signal. The present technology may operate for signals transmitted over a variety of channels including, but not limited to, copper channels, optical channels and wireless channels. For example, High Speed Serial links over copper media can be employed to communicate the signal.

Corruption of the signal may be experienced by a receiver. Such corruption may be due to a variety of factors including variation in the chips and other components manufactured for the transmitter and receiver. Also, the channel itself may corrupt the signal. The signal may also experience inter signal interference as a form of corruption. The present technology is capable of compensating for all types of corruption of the signal experienced in the communication path.

Various solutions have compensated for signal corruption by equalizing the signal with an equalizer. Equalizers may employ parameters for equalizing the signal. Such parameters are often set using predetermined default settings. Signal corruption may change during a signal communication which may lead the default parameter settings to be less effective during portions of the communication. The present technology is able to adjust or calibrate the parameters of equalization to compensate for changes in signal corruption during the signal transmission. In one embodiment, the adjustments or calibrations are performed in real time during the transmission. In one embodiment, the adjustments or calibrations occur automatically with the assistance of algorithms. Such calibration to the parameters may occur during a signal transmission and reception, but may also take place prior to an actual signal transmission. A dummy transmission may be employed to calibrate the parameters as part of a manufacturing process. Such a prior calibration of the parameters may be useful to compensate for chip to chip variations during the manufacturing process.

A continuous time linear equalizer (CTLE) uses known techniques for compensating for signal corruption. However, a CTLE does not overcome all forms of corruption nor does it completely compensate for types of corruption in which a CTLE may be effective. The present technology is well suited to adjust parameters associated with CTLE equalization techniques. Additionally, the present technology may also operate to adjust parameters for a Decision Feedback Equalizer (DFE), which is a known equalization scheme. The present technology may adjust or calibrate parameters for any equalizer associated with a communication path and may also do so for a combination of equalizers. In one embodiment, the present technology may calibrate parameters for both a CTLE and a DFE for the same signal. In one embodiment, the present technology is able to provide feedback to an equalizer associated with the transmitter such that the transmitter may calibrate parameters of an equalizer and equalize the signal before it is transmitted.

The present technology is also able to adjust or calibrate the phase offset of a signal. A signal may have a sine form where the phase offset is ideally 90 degrees. However, the optimum sampling point for a signal may not occur 90 degrees apart due to signal corruption. The present technology may operate to detect such an occurrence and adjust an IQ phase offset to a setting other than 90 degrees to overcome the effect of this corruption. In IQ modulation, I is the "in-phase" component of the wave form and Q represents the "quadrature" component.

The present invention provides a method of tuning various transceiver parameters that affect the link performance. These parameters can include any combination of one or more of the following parameters: i) transmitter feed forward equalizer (FFE) (analog or digital) parameters, such as pre-emphasis, de-emphasis, enabling or disabling taps of the FFE, etc.; ii) receiver FFE (e.g., analog or digital) parameters; iii) receiver gain stage parameters (e.g., pre/post-CTLE automatic gain control (AGC) setting, etc.) iv) clock phase adjustment parameters (e.g., IQ offset, phase interpolator calibration settings, duty cycle correction, etc.); v) receiver linear equalizer parameters (e.g., pole and zero configuration settings, etc.); vi) transceiver reconfiguration (e.g., configure number of transmit (Tx) FFE taps, determine if DFE needed or not, configure number of receive (Rx) FFE taps, etc.).

If both the transmitter and receiver are in communication via a control channel for feedback, the performance metric measured at the receiver is communicated back to the transmitter for tuning transmitter parameters to improve overall link performance.

In one embodiment, performance metric (PM) based tuning can be used in conjunction with one or more different tuning algorithms, e.g., using a PM based tuning for AGC and a least mean square (LMS) based tuning for DFE, etc. without using additional high-speed circuitry.

In one embodiment, the PM based tuning of the present disclosure can be implemented using only the existing hi-speed circuitry for the LMS adaptation. In another embodiment, specialized circuitry, e.g., analog digital converter (ADC) can be used to supplement the hi-speed circuitry used for the LMS adaptation.

The following discussion will demonstrate various hardware, software, and firmware components that are used with and in computer systems and other devices for adjusting parameters of an equalizer for a signal using various embodiments of the present technology. Furthermore, the systems and methods may include some, all, or none of the hardware, software, and firmware components discussed below.

Embodiments of Adjusting Parameters of a Transceiver

Figure 1:
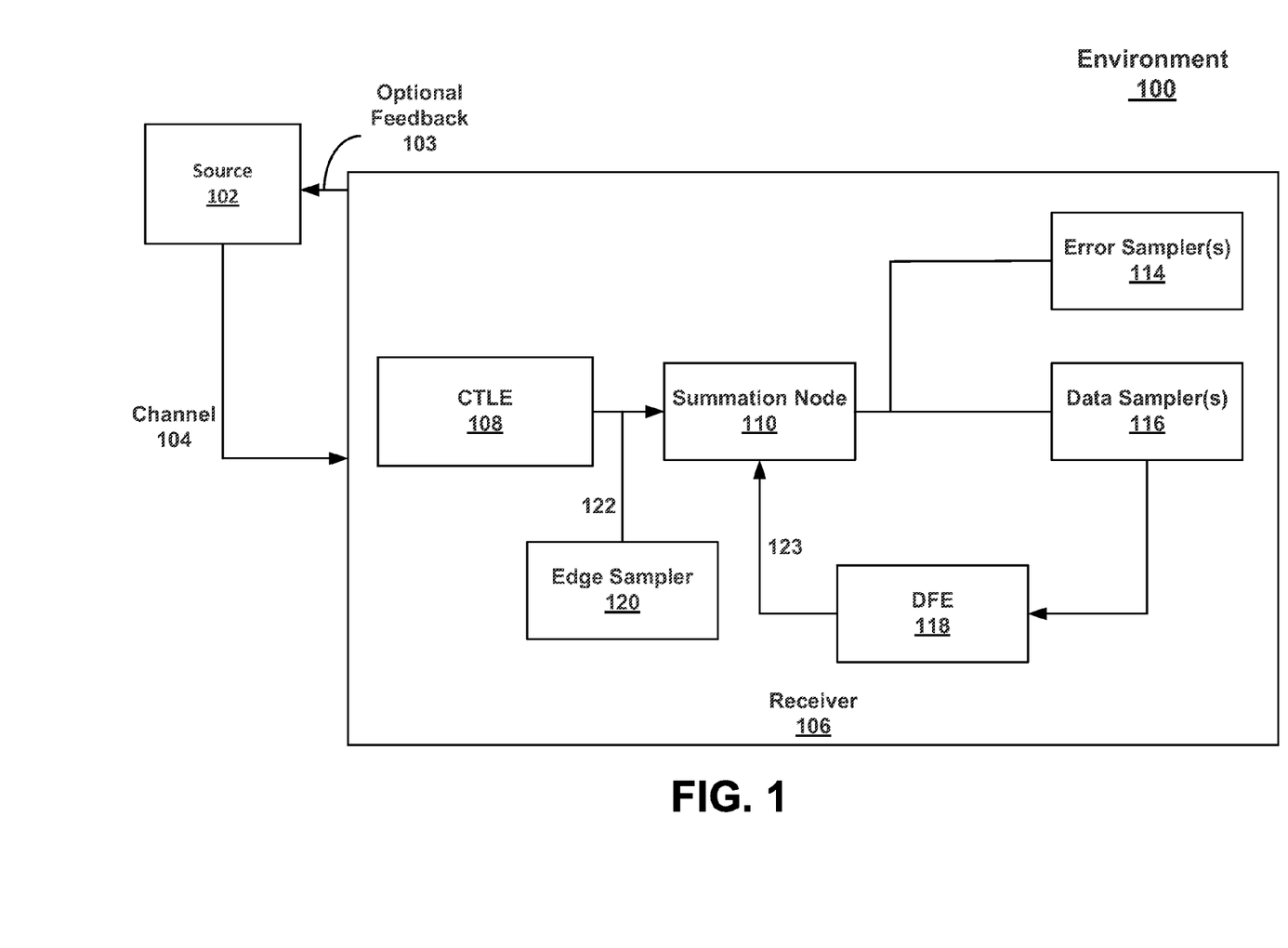
FIG. 1 illustrates a block diagram of an example environment for adjusting a parameter of an equalizer for a signal in accordance with embodiments of the present technology.

With reference to FIG. 1, a block diagram of environment 100. FIG. 1 depicts a source 102 which is a transmitter capable of transmitting a signal over channel 104. Receiver 106 is capable of receiving the signal from source 102. CTLE 108 is a continuous time linear equalizer and DFE 118 is a decision feedback equalizer, both for equalizing the signal using parameters. FIG. 1 also depicts error sampler 114 in accordance with embodiments of the present technology. Environment 100 comprises components that may or may not be used with different embodiments of the present technology and should not be construed to limit the present technology.

In one embodiment, a signal is received at receiver 106 and the signal is processed by CTLE 108 and is then sent to summation node 110. Edge detector 120 may detect the signal after it has been processed by CTLE 108 but before it reaches summation node 110 as depicted by line 122, or edge detector 120 may detect the signal as an output of summation node 110 as depicted by line 123.

During a signal transmission, receiver 106 receives the signal with corruptions and begins to equalize the signal via CTLE 108 and DFE 118. In one embodiment, error sampler 114 does not operate until CTLE 108 and DFE 118 first operate on the signal to establish some equalization. This may be considered a settling out period which occurs immediately after signal has begun to be received by receiver 106. The signal may be processed by data sampler 116 before it is processed by DFE 118. In one embodiment, error sampler 114 waits until a predetermined data count related to the signal has been received and equalized. In one embodiment, DFE 118 employs a least mean square (LMS) algorithm to adjust the parameter associated with DFE 118. Error sampler 114 may not operate until DFE 118 has completed the LMS adjustments to the parameters.

In one embodiment, the signal is processed by summation node 112 before it is processed by error sampler 114. Error sampler 114 then determines a parameter to analyze and ultimately calibrate. The parameter may be associated with CTLE 108, DFE 118 or another equalizer. Then error sampler 114 establishes a threshold in which to measure data points of the signal. The threshold may be range encompassing a portion of the wave form of the signal. The signal may have a wave form of any shape including a sine wave form. Feedback may be sent to source 102 via optional feedback 103.

Figure 4:
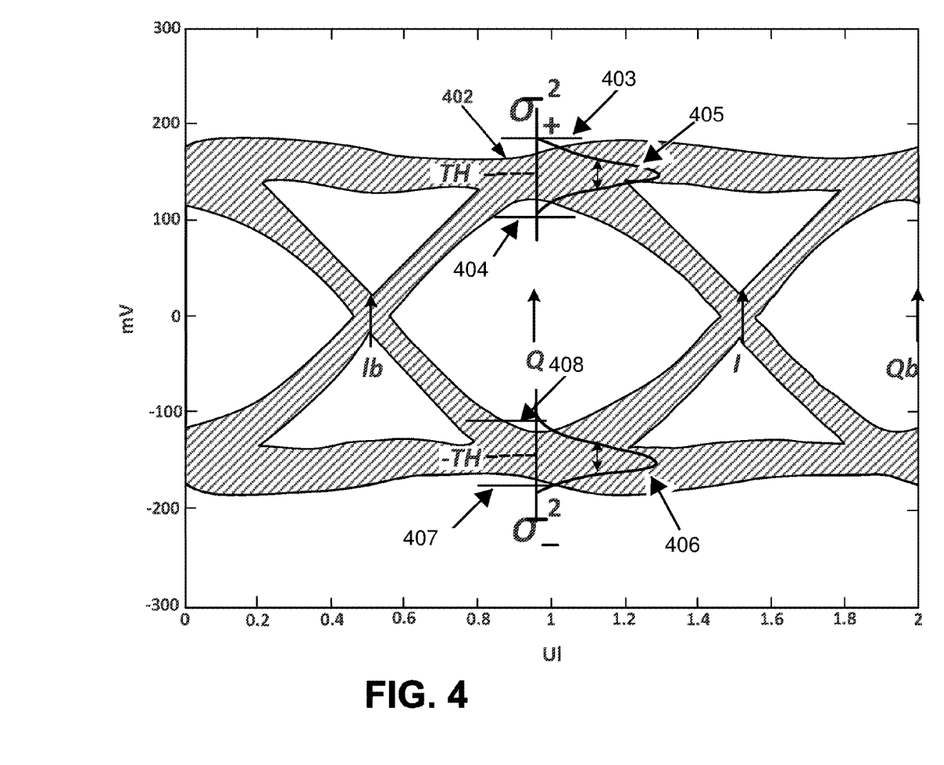
FIG. 4 illustrates a graph of a signal in accordance with embodiments of the present technology.

For example, FIG. 4 depicts a data signal received over a period of time. The wave form of the signal appears to form an eye and is referred to in the art as a data eye. 402 of FIG. 4 depicts the peak of the data eye. Error sampler 114 may establish a threshold with a range that encompasses a portion of the wave. In one embodiment, error sampler 114 establishes a threshold at peak 402 of FIG. 4 to sample data points. The threshold may be defined by an upper and lower threshold that create the range in which to sample data points. Error sampler 114 then samples the data points of the signal. This can occur for a predetermined number of data points such as 10,000 data points. Error sampler 114 is not limited to a certain number of data points which it must sample, and the number of data points which it must sample may be changed. In sampling the data, error sampler 114 may be programmed to determine that all data points within the threshold have a value of 1 and all data points outside the threshold have a value of 0. In one embodiment, may operate to record an actual value of the amplitude of the signal. For example, the threshold may be established such that amplitude of the data points within the range of the threshold are actually 0.9 as opposed to 1. This actual measurement allows for greater calibration of the parameters.

In one embodiment, error sampler 114 is able to adjust the threshold in which it is sampling data points based on a predetermined percentage of data points sampled in the threshold. For example, error sampler 114 may sample data within a threshold and determine that 70% of the data points fall within the threshold. Error sampler 114 may then determine to keep the threshold at the same range or may adjust the threshold to reduce the range in which data points are sampled. By reducing the range of the threshold, error sampler 114 may be able to provide better performance metrics to the equalizer.

Error sampler 114 then computes a statistical density of the data points that fall within the threshold. The statistical density is used to determine a performance metric. The performance metric is then sent to the equalizer with the associated parameter being analyzed. For example, error sampler 114 may be analyzing a parameter associated with CTLE 108 and thus error sampler 114 will send the performance metric to CTLE 108. CTLE 108 may then use the performance metric to adjust the parameter to better compensate for the experienced corruption of the signal. The adjustments to the parameter may be automatic through the use of algorithms for both error sampler 114 and the equalizer and may also be described as calibrating, tuning, or tweaking. In this manner, error sampler 114 operates to adjust the parameters of CTLE 108 and DFE 118 to more finely tune the signal and thus compensate for the corruption more than what a CTLE and a DFE would be capable of alone. The present technology also operates such that a CTLE, a DFE and error sampler 114 are operating in parallel to compensate for corruption.

In one embodiment, error sampler 114 is a circuit which employs hardware components to carry out the present technology. The circuit may be hardwired with algorithms to carry out the techniques of the present technology. In one embodiment, error sampler 114 offloads its computational requirements to an alternate computer system. In one embodiment, error sampler 114 provides a performance metric to an equalizer not associated with receiver 106. For example, source 102 may comprise an equalizer that may be calibrated with a performance metric computed by error sampler 114. Additionally, an error sampler may be associated with source 102 to calibrate an equalizer for source 102. Thus the present technology may be carried out using only a transmitter, only a receiver, or a combination of a transmitter and a receiver.

In one embodiment, error sampler 114 operates to repeat procedures for a given parameter such that the same parameter may be analyzed and adjusted or calibrated multiple times during a signal transmission. In one embodiment, several parameters are repeatedly analyzed by error sampler 114 in a cycle such that an algorithm associated with error sampler 114 will cycle through the various parameters calibrating the parameters in real time during a signal transmission. Such an algorithm can be programmed to use a variety of techniques in how to cycle through the parameters. For example, the algorithm may cycle through all parameters, each in turn. Alternatively, the algorithm may identify priority parameters that are analyzed and calibrated more frequently than other parameters. In one embodiment, error sampler 114 analyzes and calibrates 640 parameters.

In one embodiment, error sampler 114 stores a first performance metric for a given parameter. Once error sampler 114 analyzes the given parameter again, it generates a second performance metric. Error sampler 114 then compares the first and second performance metric to determine which performance metric is a highest performance metric, or in other words, which performance metric better compensates for the corruption of the signal. Error sampler 114 then stores the highest performance metric for the given parameter. This technique of generating a second performance metric and only storing a highest performance metric may occur a plurality of times during a given signal transmission as the given parameter is analyzed over and over again by error sampler 114. In one embodiment, error sampler 114 only stores one performance metric for a given parameter such that only the one performance metric is used to calibrate the given parameter.

The present technology overcomes limitations of manually adjusting parameters for an equalizer by automating the process of calibration using statistical densities to calculate a performance metric using algorithms associated with both the error sampler and the equalizer. The present technology also allows a receiver to receive a signal with more loss than the prior art allows because it automatically calibrates the signal to compensate for corruption and loss.

Figure 2:
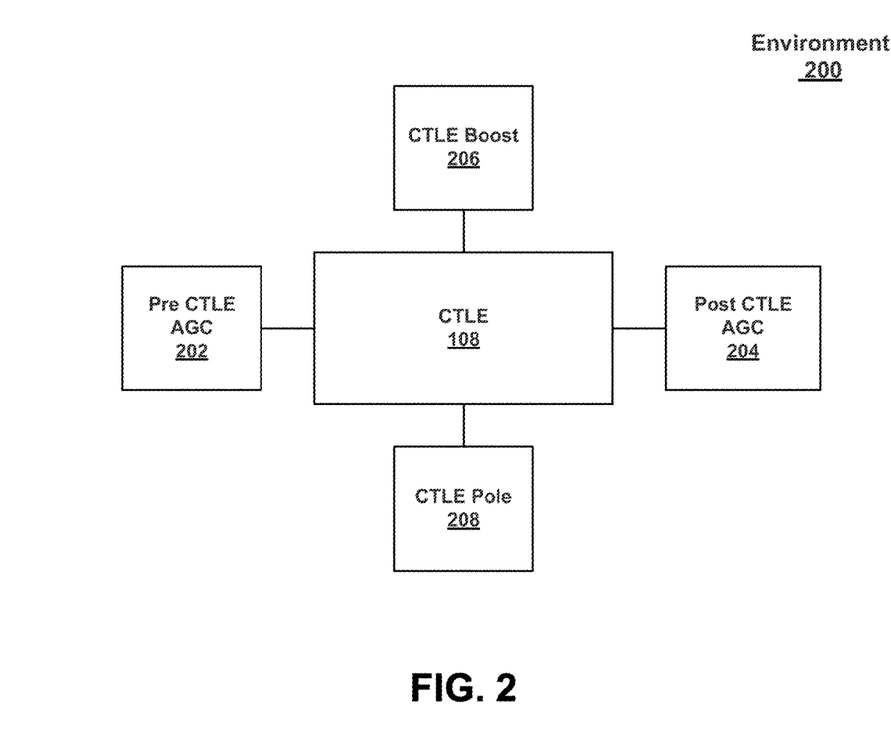
FIG. 2 illustrates a block diagram of an example environment for adjusting a parameter of an equalizer for a signal in accordance with embodiments of the present technology.

With reference now to FIG. 2, a block diagram of environment 200. FIG. 2 depicts CTLE 108 comprising the same capabilities of CTLE 108 of FIG. 1. FIG. 2 also depicts four parameters associated with CTLE 108 which may be automatically calibrated in accordance with embodiments of the present technology. Pre CTLE AGC 202 is a pre CTLE automatic gain control (AGC) which operates to control the gain of the signal prior to operation of CTLE 108. At PRE CTLE AGC 202 the signal may be in a pre-AGC stage that is independently controlled to fix the signal level at the input to CTLE 108 to a known level (for e.g. 600 mV ppd.). CTLE 108 may de-emphasize the lower frequencies in order to equalize the signal across the spectrum and as a result a post-AGC is required to compensate for the direct current (DC) loss and bring the signal to a healthy level before sampling (e.g. 200 mV ppd).

Similarly, Post CTLE AGC 204 operates to control the gain after the operation of CTLE 108. CTLE boost 206 is a parameter that accounts for the loss of the channel. The CTLE typically boosts the signal to overcome such a loss. The boost may be related to frequency domain and amplitude of the signal. CTLE pole 208 is a parameter that allows CTLE 108 to pole the signal to compensate for loss.

Figure 3:
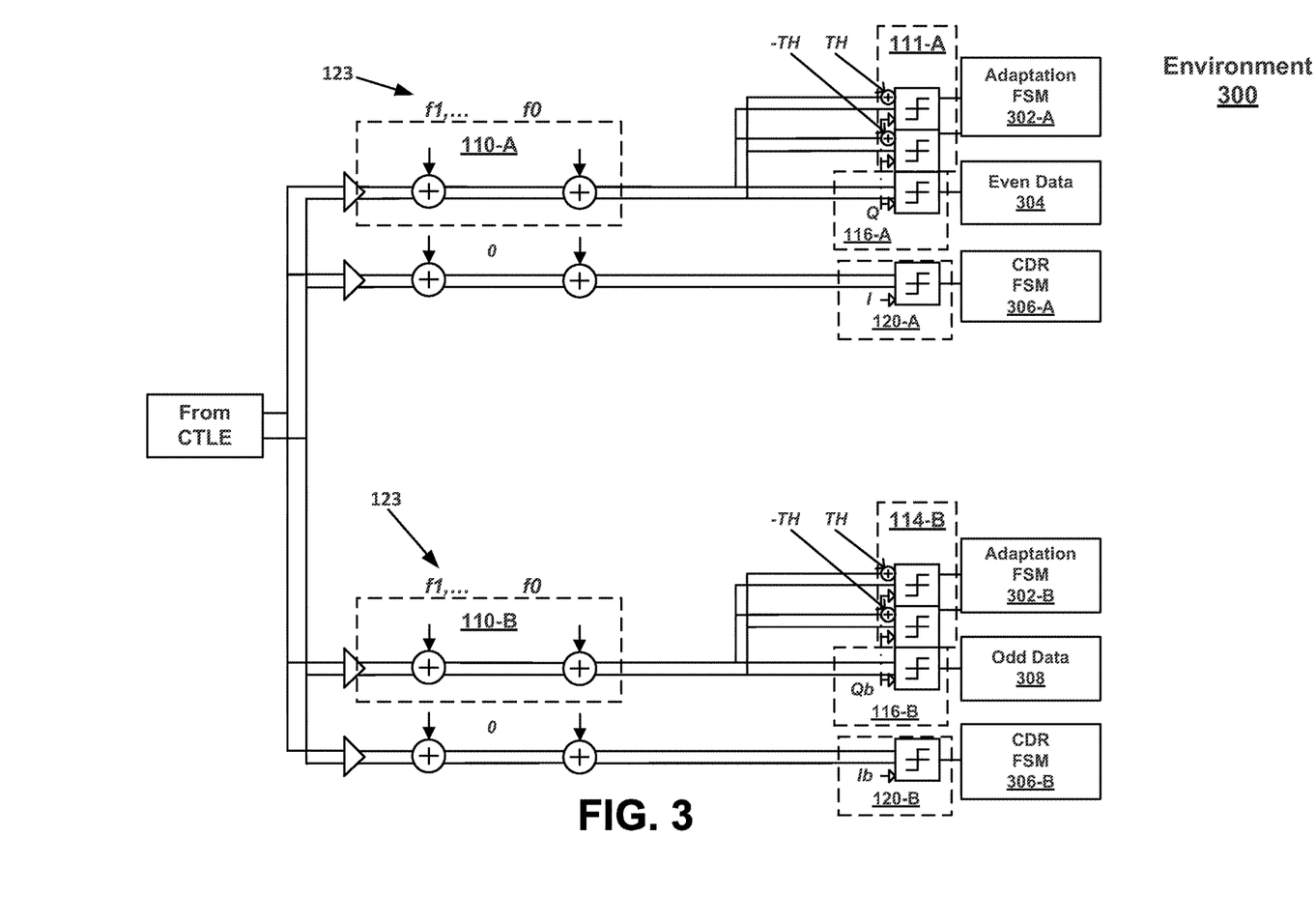
FIG. 3 illustrates a block diagram of an example environment for adjusting a parameter of an equalizer for a signal in accordance with embodiments of the present technology.

With reference now to FIG. 3, a block diagram of environment 300. FIG. 3 depicts a DFE portion of an equalizer that comprises feedback summers 110-A and 110-B, data samplers 111-A and 111-B, edge samplers 120-A and 120-B, error samplers 116-A and 116-B with variable threshold control, adaptation finite state machine (FSM) 302-A and 302-B, clock data recover (CDR) FSM 306-A and 306-B, even data 304 and odd data 308. In one embodiment, as shown in FIG. 3, the edge samplers are depicted at 120-A and 120-B and may have a dummy summer (not shown) at their input to match the delay with the data sampler path. Thus the input to edge samplers is not affected by the dynamics of DFE coefficient adaptation and hence the CDR outputs a steady clock. FIG. 3 also depicts an embodiment having multiple error samplers. 116-A and 116-B depicts error samplers with thresholds −TH and TH respectively. These four error samplers work in parallel with a DFE to automatically calibrate parameters of the DFE.

In one embodiment, the CDR FSM 306-A or 306-B outputs a half-rate clock which is taken into a DLL to produce 4 phases such as Q, I, Qb and Ib. Different phases may drive different samplers as shown in FIG. 3. Nominally with Va=0, the DLL will produce 4 phases separated by 90 degrees. The I and Ib phases clock the edge samplers which see the CTLE output, while the Q and Qb phases clock the data samplers which see the DFE output.

In the present embodiment multiple error samplers are illustrated. In another embodiment, a single error sampler is sufficient. This is because the statistics of the four error samplers is the same. If the signal is received from an optical link, then multiple samplers, e.g., all four samplers, would be used for the channel, because an optical signal has different characteristics around the four error sampler thresholds.

With reference now to FIG. 4, a chart of the wave form of a signal is shown. FIG. 4 depicts a wave form with the appearance of a data eye. FIG. 4 also depicts two error samplers, one at the top of the data eye and one at the bottom. Each error sampler samples data points with the threshold TH or −TH respectively. The data points fall within the upper limit 403 and lower limit 404 of the threshold (TH) in one embodiment and within the upper limit 405 and lower limit 406 of the threshold (−TH) in another embodiment and are represented by respective bell curves (407 and 408). FIG. 4 depicts the error in a signal approximated as a Gaussian distribution with mean TH. An LMS algorithm may be used to reduce the mean squared error at the sampling phase.

Operations

Figure 5:
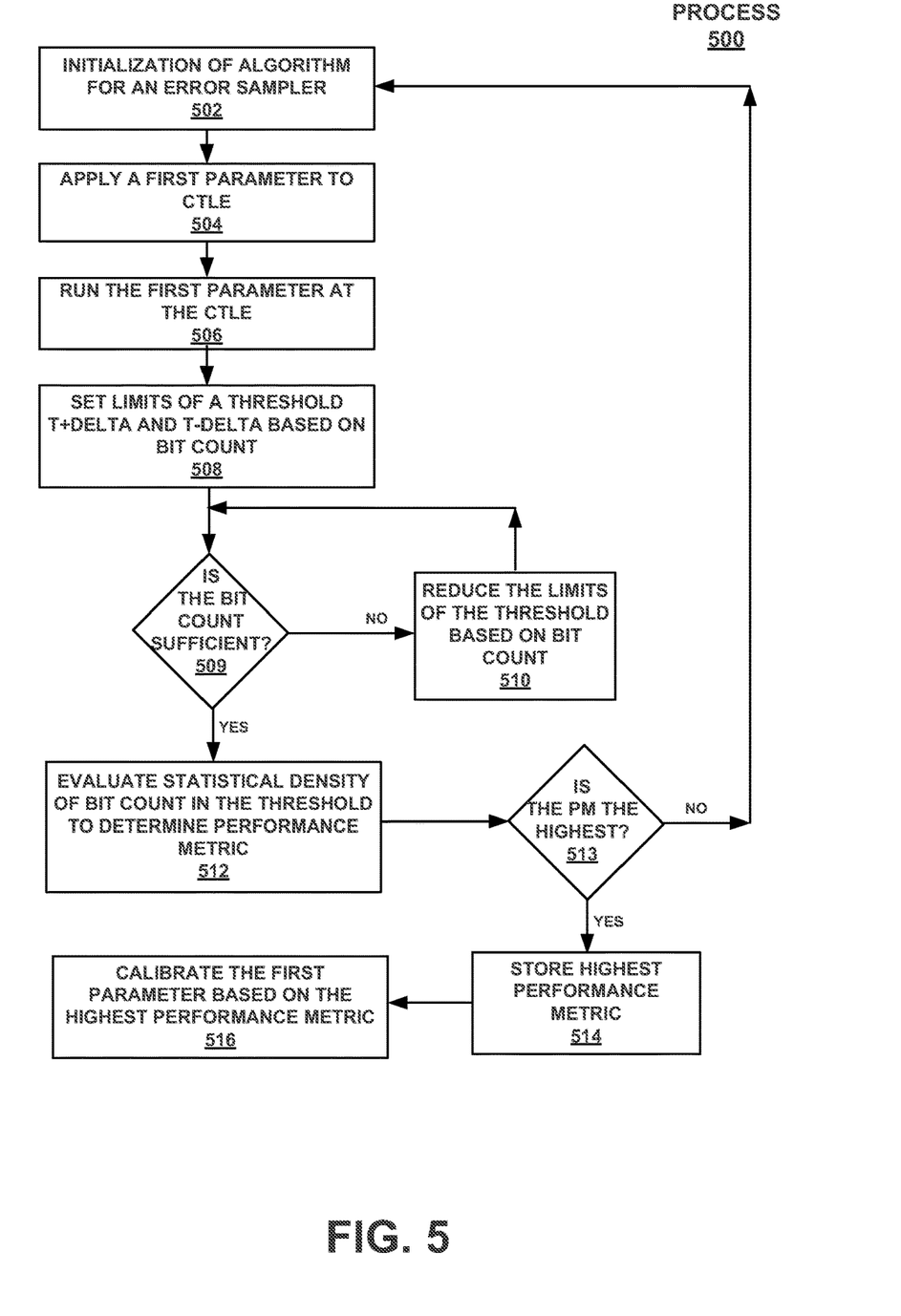
FIG. 5 illustrates a flowchart of an example method for adjusting a parameter of an equalizer for a signal in accordance with embodiments of the present technology.

FIG. 5 is a flowchart illustrating process 500 for automatically calibrating a parameter associated with an equalizer. The automatic calibration is used to compensate for signal corruption. Process 500 may be carried out by a circuit or a plurality of circuits. Process 500 may also have portions offloaded to a computer system. In one embodiment, process 500 is carried out by processors or microcontrollers and electrical components under the control of computer readable and computer executable instructions stored on a non-transitory computer-usable storage medium. Process 500 may be performed by components of environment 100 of FIG. 1 or environment 300 of FIG. 3 or in an embodiment not depicted in the figures.

At 502, initialization of algorithm for an error sampler. For example, error sampler 114 may be initiated upon the receipt of a signal at a receiver.

At 504, apply a first parameter to CTLE. The CTLE is allowed to operate to equalize the signal. In one embodiment, the error sampler waits until the CTLE performs initial operations to settle out. The error sampler selects the first parameter as the parameter to analyze.

At 506, run the first parameter at the CTLE. The error sampler then performs a bit count of data points. In one embodiment, the error sampler obtains a 10,000 bit count.

At 508, set limits of a threshold Th+Delta and Th−Delta based on bit count. Step 506 may be repeated for each of Th+Delta and Th−Delta respectively.

At 509, a bit count may be performed within the threshold created at step 508. If the bit count is high enough, the process may proceed to stop 512. If the bit count is not high enough, the process will proceed to step 510.

At 510, reduce limits of the threshold based on bit count. In one embodiment, step 510 is not required as the threshold encompass a sufficient range such that a reduction is not required. In one embodiment, the limits of the threshold are reduced when the bit count has reached a predetermined percentage within the range of the threshold (e.g. 70% of the data points are sampled within the range of the thresholds). The reduction of the limits of the threshold provides for more refined data. After 510 is complete, step 509 may be repeated until the process moves on to step 512.

At 512, evaluate statistical density of bit count in the threshold to determine performance metric. The performance metric is based on the statistical density of data points sampled within the range of the threshold.

At 513, a determination is made whether the performance metric is higher than the currently stored performance metric. If it is, the process proceeds to step 514. If it is not the highest stored performance metric, then the currently stored highest performance metric is used to adjust or calibrate the parameters and the process goes back to step 502 and repeats.

At 514, store highest performance metric. More than one performance metric may be obtained when the process is repeated for the same parameter. In one embodiment, process 500 will only store one performance metric which is the highest performance metric which provides for optimum calibration of the parameter.

At 516, calibrate the first parameter based on the highest performance metric. Such calibration may take place using algorithms at the CTLE. For example, the error sampler may send the performance metric to the CTLE to calibrate or adjust the parameter. Process 500 may be repeated constantly or at set intervals to achieve the highest performance metric.

Figure 6:
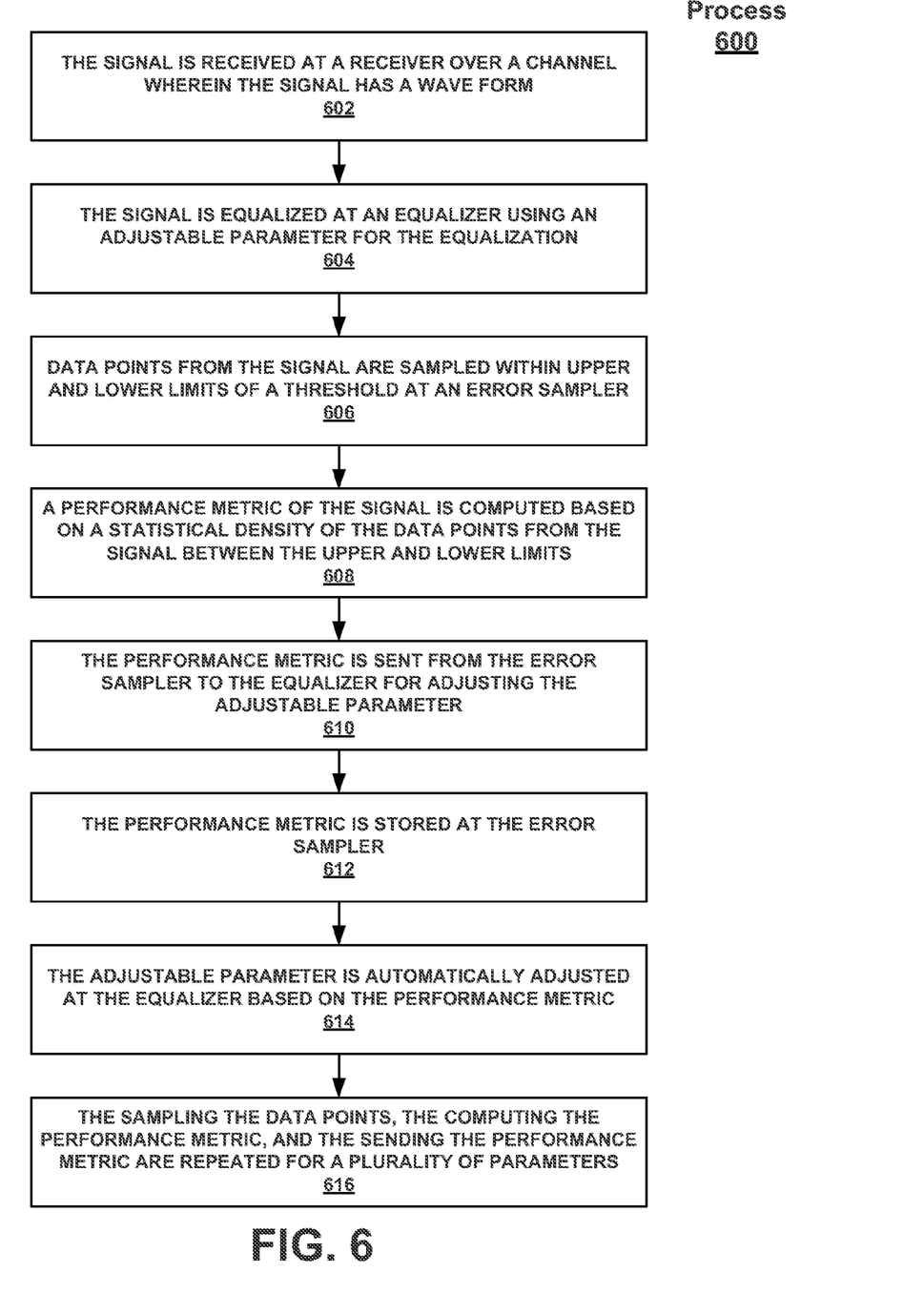
FIG. 6 illustrates a flowchart of an example method for analyzing a signal in accordance with embodiments of the present technology.

FIG. 6 is a flowchart illustrating process 600 for analyzing a signal. The analysis is used to compensate for signal corruption. Process 600 may be carried out by a circuit or a plurality of circuits. Process 600 may also have portions offloaded to a computer system. In one embodiment, process 600 is carried out by processors or micro-controllers and electrical components under the control of computer readable and computer executable instructions stored on a non-transitory computer-usable storage medium. Process 600 may be performed by components of environment 100 of FIG. 1 or environment 300 of FIG. 3 or in an embodiment not depicted in the figures.

At 602, the signal is received at a receiver over a channel wherein the signal has a wave form. The channel may be, but is not limited to, a copper channel, a wireless channel, and an optical channel.

At 604, the signal is equalized at an equalizer using an adjustable parameter for the equalization. The equalizer may be, but is not limited to, a continuous time linear equalizer, a decision feedback equalizer, a receiving equalizer, and a transmitting equalizer.

At 606, data points from the signal are sampled between upper and lower limits of a threshold at an error sampler. A predetermined number of data points may be sampled. In one embodiment, the upper and lower limits of the threshold substantially encompass a peak of the wave form. In one embodiment, the upper and lower thresholds encompass a portion of the wave form.

At 608, a performance metric of the signal is computed based on a statistical density of the data points from the signal between the upper and lower limits. In one embodiment, the sampling of the data points and the computing of the performance metric occurs in parallel at a plurality of error samplers wherein each of the plurality of error samplers samples the data points from a different portion of the wave form.

At 610, the performance metric is sent from the error sampler to the equalizer for adjusting the adjustable parameter. The adjustable parameter may be, but is not limited to, a phase offset of the signal, a pre continuous time linear equalizer (CTLE) automatic gain control (AGC), a post CTLE AGC, a CTLE boost, and a CTLE pole.

At 612, the performance metric is stored at the error sampler.

At 614, the adjustable parameter is automatically adjusted at the equalizer based on the performance metric. For example, the performance metric (PM) measured at the receiver may be communicated back to the transmitter for tuning transmitter parameters to improve overall link performance. PM based tuning can be used in conjunction with one or more different tuning algorithms, e.g., using a PM based tuning for AGC and a least mean square (LMS) based tuning for DFE, etc. without using additional high-speed circuitry.

At 616, the sampling the data points, the computing the performance metric, and the sending the performance metric are repeated for a plurality of parameters. In one embodiment, several parameters are repeatedly analyzed by error sampler 114 in a cycle such that an algorithm associated with error sampler 114 will cycle through the various parameters calibrating the parameters in real time during a signal transmission. Such an algorithm can be programmed to use a variety of techniques in how to cycle through the parameters. For example, the algorithm may cycle through all parameters, each in turn. Alternatively, the algorithm may identify priority parameters that are analyzed and calibrated more often relative to other parameters. In one embodiment, error sampler 114 analyzes and calibrates 640 parameters.

Figure 7:
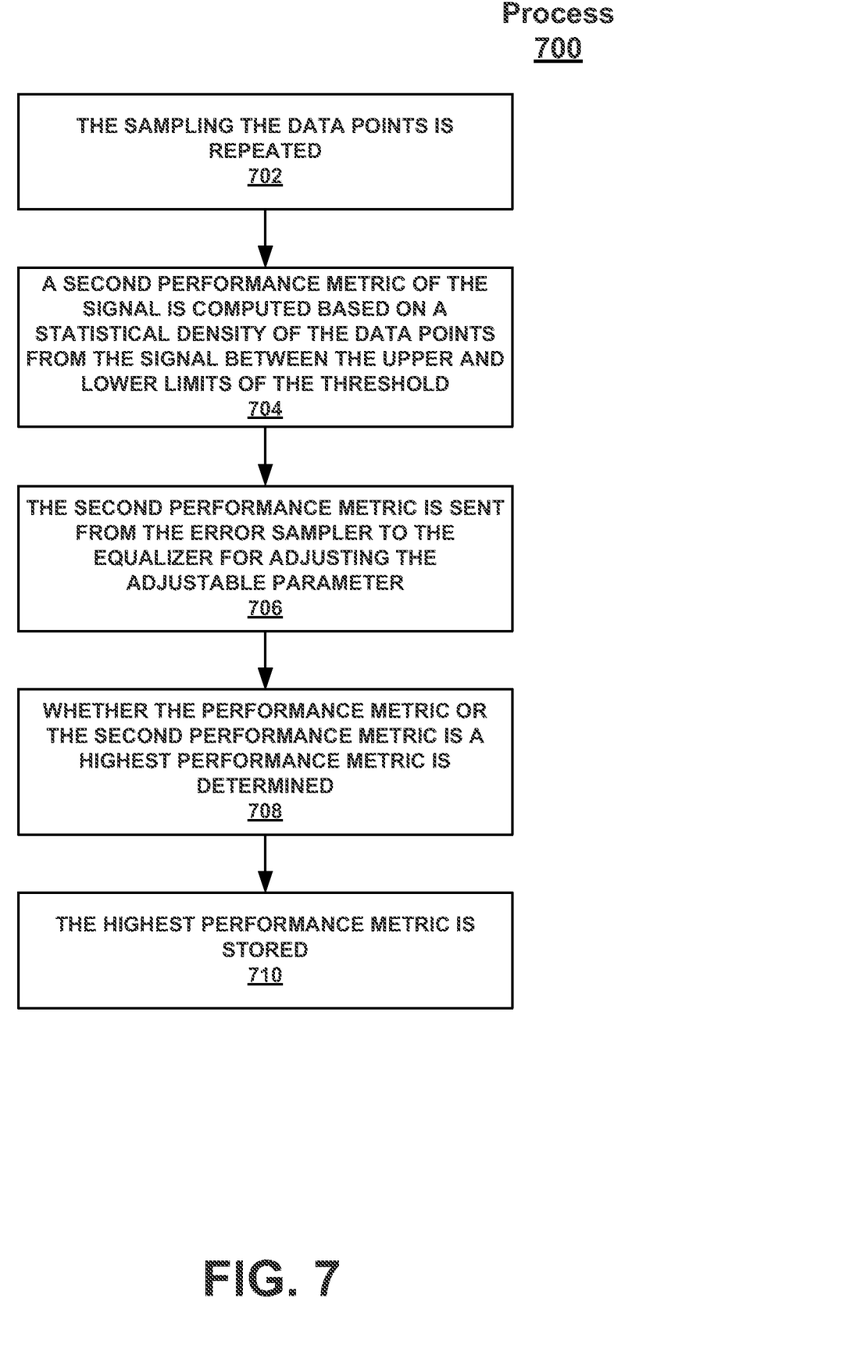
FIG. 7 illustrates a flowchart of an example method for analyzing a signal in accordance with embodiments of the present technology.

FIG. 7 is a flowchart illustrating process 700 for determining thresholds for calibrating parameters of a signal. The analysis is used to compensate for signal corruption. Process 700 may be carried out by a circuit or a plurality of circuits. Process 700 may also have portions offloaded to a computer system. In one embodiment, process 700 is carried out by processors or micro-controllers and electrical components under the control of computer readable and computer executable instructions stored on a non-transitory computer-usable storage medium. Process 700 may be performed by components of environment 100 of FIG. 1 or environment 300 of FIG. 3 or in an embodiment not depicted in the figures.

Process 700 may be performed using the results of Process 600. Processes 600 and 700 may be combined for a single process that may or may not include all of the steps of Processes 600 and 700.

At 702, the sampling the data points is repeated.

At 704, a second performance metric of the signal is computed based on a statistical density of the data points from the signal between the upper and lower limits of the threshold.

At 706, the second performance metric is sent from the error sampler to the equalizer for adjusting the adjustable parameter.

At 708, whether the performance metric or the second performance metric is a highest performance metric is determined.

At 710, the highest performance metric is stored.

Figure 8:
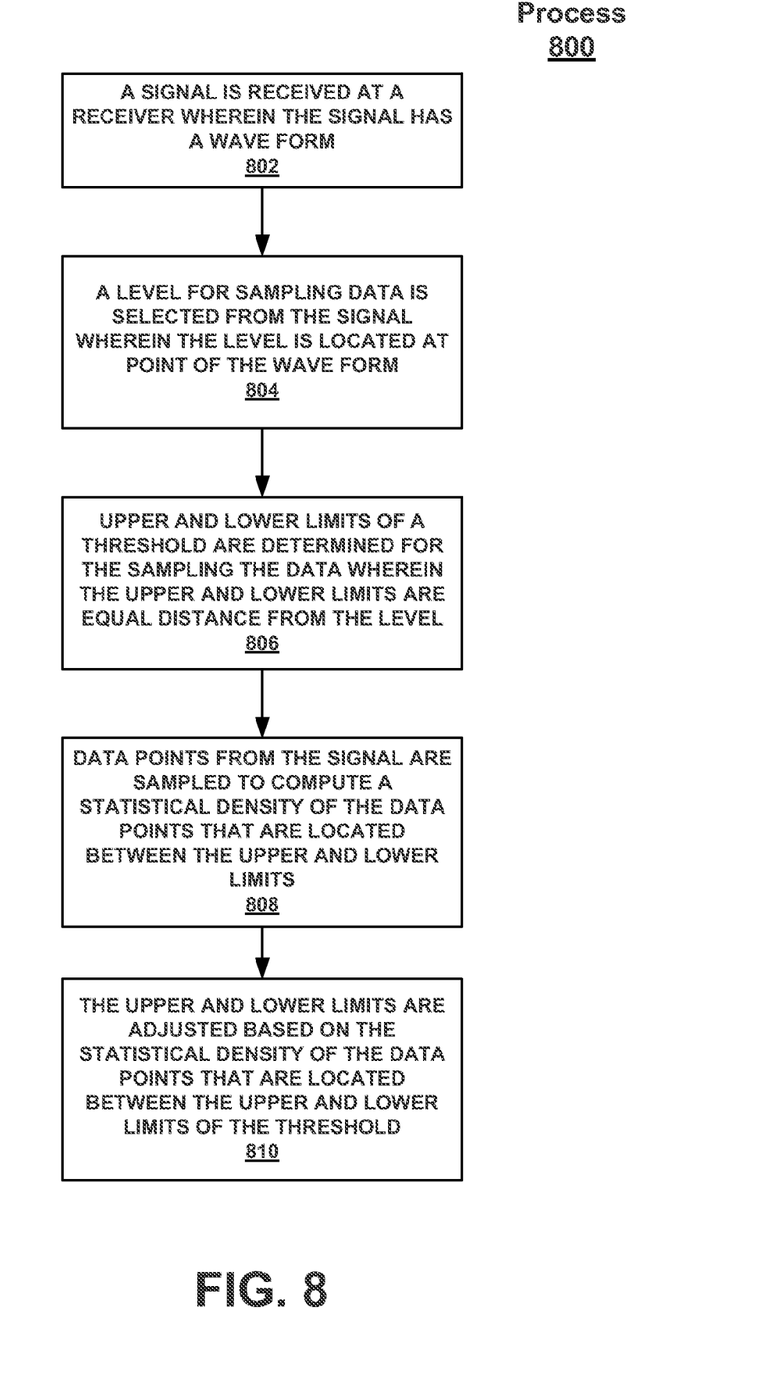
FIG. 8 illustrates a flowchart of an example method for determining thresholds for calibrating parameters of a signal in accordance with embodiments of the present technology.

FIG. 8 is a flowchart illustrating process 800 for determining thresholds for calibrating parameters of a signal. The analysis is used to compensate for signal corruption. Process 800 may be carried out by a circuit or a plurality of circuits. Process 800 may also have portions offloaded to a computer system. In one embodiment, process 800 is carried out by processors or micro-controllers and electrical components under the control of computer readable and computer executable instructions stored on a non-transitory computer-usable storage medium. Process 800 may be performed by components of environment 100 of FIG. 1 or environment 300 of FIG. 3 or in an embodiment not depicted in the figures.

At 802, a signal is received at a receiver wherein the signal has a wave form.

At 804, a level for sampling data is selected from the signal wherein the level is located at point of the wave form.

At 806, upper and lower limits of a threshold are determined for the sampling the data wherein the upper and lower limits are equal distance from the level. The upper and lower limits define the threshold. Sampled bits from a signal may or may not fall into a threshold.

At 808, data points from the signal are sampled to compute a statistical density of the data points that are located between the upper and lower limits. A portion of the signal may fall into the threshold and this portion is used to compute the statistical density. Error sampler 114 may be employed to compute a statistical density of the data points that fall within the threshold. The statistical density may be used to determine a performance metric.

At 810, the upper and lower limits are adjusted based on the statistical density of the data points that are located between the upper and lower limits. In one embodiment, adjusting the upper and lower limits adjusts a distance of the upper and lower limits from the level. In one embodiment, adjusting the upper and lower limits adjusts a position of the level relative to the wave form and subsequently adjusts a location of the upper and lower limits to be equal distance from the level. In one embodiment, adjusting the upper and lower limits maintains a position of the upper and lower limits if a predetermined portion of the data points are located within the threshold. In one embodiment, adjusting the upper and lower limits occurs after the sampling the data points has sampled a predetermined number of data points.

Example Computer System Environment

Portions of the present technology are composed of computer-readable and computer-executable instructions that reside, for example, in computer-usable media of a computer system or other user device. Described below is an example computer system or components that may be used for or in conjunction with aspects of the present technology.

It is appreciated that that the present technology can operate on or within a number of different computer systems including general purpose networked computer systems, embedded computer systems, routers, switches, server devices, user devices, various intermediate devices/artifacts, stand-alone computer systems, mobile phones, personal data assistants, televisions and the like. The computer system is well adapted to having peripheral computer readable media such as, for example, a floppy disk, a compact disc, and the like coupled thereto.

The computer system includes an address/data bus for communicating information, and a processor coupled to bus for processing information and instructions. The computer system is also well suited to a multi-processor or single processor environment and also includes data storage features such as a computer usable volatile memory, e.g. random access memory (RAM), coupled to bus for storing information and instructions for processor(s).

The computer system may also include computer usable non-volatile memory, e.g. read only memory (ROM), as well as input devices such as an alpha-numeric input device, a mouse, or other commonly used input devices. The computer system may also include a display such as liquid crystal device, cathode ray tube, plasma display, and other output components such as a printer or other common output devices.

The computer system may also include one or more signal generating and receiving device(s) coupled with a bus for enabling the system to interface with other electronic devices and computer systems. Signal generating and receiving device(s) of the present embodiment may include wired serial adaptors, modems, and network adaptors, wireless modems, and wireless network adaptors, and other such communication technology. The signal generating and receiving device(s) may work in conjunction with one or more communication interface(s) for coupling information to and/or from the computer system. A communication interface may include a serial port, parallel port, Universal Serial Bus (USB), Ethernet port, antenna, or other input/output interface. A communication interface may physically, electrically, optically, or wirelessly (e.g. via radio frequency) couple the computer system with another device, such as a cellular telephone, radio, a handheld device, a smartphone, or computer system.

Although the subject matter is described in a language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed:

1. A method for transforming a corrupt signal to an equalized signal in a receiver, comprising:
   receiving said corrupt signal at said receiver over a channel wherein said corrupt signal has a wave form;
   sampling data points of said corrupt signal at an error sampler between an upper limit and a lower limit for each of a positive threshold (TH) range and of a negative threshold (-TH) range;
   generating, in said error sampler, a performance metric of said corrupt signal based on a density of said data points of said corrupt signal that are disposed within said upper limit and said lower limit of said positive threshold (TH) range and of said negative threshold (-TH) range;
   sending said performance metric from said error sampler to an equalizer for adjusting an adjustable parameter;
   automatically adjusting said adjustable parameter at said equalizer based on said performance metric; and
   equalizing said corrupt signal in said equalizer to create said equalized signal based on said adjustable parameter; and wherein:
      said sampling of data points of said corrupt signal at said error sampler is not required between said lower limit of said positive threshold (TH) range and said upper limit of said negative threshold (-TH) range.

2. The method of claim 1 wherein said upper limit and said lower limit of said positive threshold (TH) range and of said negative threshold (-TH) range encompass a portion of said wave form.

3. The method of claim 1 further comprising:
   adjusting said upper and lower limits of said positive threshold (TH) range and of said negative threshold (-TH) range; and
   repeating said sampling operation of said data points from said signal to sample a distribution.

4. The method of claim 1 wherein said operation of sampling data points samples a predetermined number of data points as a bit count of data points.

5. The method of claim 1, further comprising:
   storing said performance metric at said error sampler.

6. The method of claim 1 wherein:
   a given wave form is communicated in parallel to a plurality of error samplers; and
   said operations of sampling data points and generating said performance metric occur in parallel at a plurality of error samplers in a device, wherein each of said plurality of error samplers samples said data points from a different portion of said wave form.

7. The method of claim 1, further comprising:
   repeating said operation of sampling data points;
   generating a second performance metric of said signal based on a density of said data points from said signal between said upper and lower limits of said positive threshold (TH) range and of said negative threshold (-TH) range;
   sending said second performance metric from said error sampler to said equalizer for adjusting said adjustable parameter;
   determining whether said performance metric or said second performance metric is a highest performance metric; and
   storing said highest performance metric.

8. The method of claim 1, further comprising:
   repeating operations of sampling said data points, said generating said performance metric, and said sending said performance metric for a plurality of parameters.

9. The method of claim 1 wherein said equalizer is selected from a group of equalizers consisting of: a continuous time linear equalizer, a decision feedback equalizer, a receiving equalizer, and a transmitting equalizer.

10. The method of claim 1 wherein said adjustable parameter is selected from a group of parameters consisting of: a phase offset of said signal, a pre continuous time linear equalizer (CTLE) automatic gain control (AGC), a post CTLE AGC, a CTLE boost, and a CTLE pole.

11. The method of claim 1 wherein said channel is selected from a group of channels consisting of: a copper channel, a wireless channel, and an optical channel.

12. A circuit for transforming a corrupt signal to an equalized signal, comprising:
   a receiver for receiving said corrupt signal over a channel from a transmitter wherein said corrupt signal has a wave form, said receiver further comprising:
      an equalizer for equalizing said corrupt signal using an adjustable parameter; and
      an error sampler for sampling data points of said corrupt signal between an upper limit and a lower limit for each of a positive threshold (TH) range and of a negative threshold (-TH) range; and wherein:
         said error sampler generates a performance metric of said corrupt signal based on a density of said data points of said corrupt signal that are disposed between said upper limit and said lower limit of said positive threshold (TH) range and of said negative threshold (-TH) range;
         said error sampler sends said performance metric from said error sampler to said equalizer for adjusting said adjustable parameter;
         said equalizer automatically adjusts said adjustable parameter based on said performance metric; and said equalizer equalizes said signal from said corrupt signal to said equalized signal based on said adjustable parameter; and wherein:

said error sampler is not required to sample data points of said corrupt signal between said lower limit of said positive threshold (TH) range and said upper limit of said negative threshold (−TH) range.

13. The circuit of claim 12, wherein said receiver further comprises:

a storage module for storing said performance metric.

14. The circuit of claim 12, wherein said equalizer is selected from a group of equalizers consisting of: a continuous time linear equalizer, a decision feedback equalizer, a receiving equalizer, and a transmitting equalizer.

15. The circuit of claim 12, wherein said receiver further comprises:

an edge detector.

16. The circuit of claim 12, wherein said receiver further comprises:

a summation node.

17. A method for transforming a corrupt signal to an equalized signal in a receiver, said method comprising:

receiving at said receiver, said corrupt signal having a wave form;

selecting at said receiver, a level for sampling of data of said signal wherein said level is located at a point of said wave form;

establishing at said receiver, an upper limit and a lower limit for each of a positive threshold (TH) range and of a negative threshold (−TH) range for said sampling of data, wherein said upper limit and said lower limit are disposed an equal distance from said level;

sampling at said receiver, data points from said corrupt signal;

generating, in an error sampler disposed in said receiver, a performance metric of said corrupt signal based on a density of said data points of said corrupt signal that are disposed within said upper limit and said lower limit of said positive threshold (TH) range and of said negative threshold (−TH) range:

adjusting at said receiver, said upper and lower limits based on said density of said data points that are located between said upper and lower limits; and equalizing said corrupted signal to said equalized signal using said performance metric based on said density; and wherein:

said sampling of data points of said corrupt signal at said receiver is not required between said lower limit of said positive threshold (TH) range and said upper limit of said negative threshold (−TH) range.

18. The method of claim 17 wherein said adjusting of said upper and lower limits adjusts a distance of said positive and negative thresholds from said level.

19. The method of claim 17 wherein said adjusting said upper and lower limits adjusts a position of said level relative to said wave form and subsequently adjusts a location of said upper and lower limits of said positive threshold (TH) range and of said negative threshold (−TH) range to be an equal distance from said level.

20. The method of claim 17 further comprising:

adjusting said upper and lower limits such that a predetermined portion of said data points are located between said upper and lower limits of said positive threshold (TH) range and of said negative threshold (−TH range.

21. The method of claim 17 wherein said adjusting said upper and lower limits of said positive threshold (TH) range and of said negative threshold (−TH) range occurs after said sampling said data points has sampled a predetermined number of data points.

22. A circuit for determining thresholds for calibrating parameters of a signal, comprising:

a receiver for receiving said signal over a channel from a transmitter wherein said signal has a wave form, said receiver further comprising:

an equalizer for equalizing said signal using an adjustable parameter; and an error sampler for sampling data of said signal disposed between an upper limit and a lower limit for each of a positive threshold (TH) range and of a negative threshold (−TH) range, for generating a performance metric based on a density of data points disposed between said upper and lower limits of said positive threshold (TH) range and of said negative threshold (−TH) range, and for adjusting of said upper and lower limits based on said density of said data points that are located between said upper and lower limits of said positive threshold (TH) range and of said negative threshold (−TH) range; and wherein:

said signal is transformed from a corrupted signal to an equalized signal using said adjustable parameter which is automatically adjusted based on said performance metric; and said sampling of data points of said signal at said error sampler is not required between said lower limit of said positive threshold (TH) range and said upper limit of said negative threshold (−TH) range.

* * * * *